(12) United States Patent
Aliyu et al.

(10) Patent No.: US 6,261,955 B1
(45) Date of Patent: Jul. 17, 2001

(54) APPLICATION OF VAPOR PHASE HFACAC-BASED COMPOUND FOR USE IN COPPER DECONTAMINATION AND CLEANING PROCESSES

(75) Inventors: Yakub Aliyu; Simon Chooi; Mei Sheng Zhou; John Leonard Sudijono; Subhash Gupta; Sudipto Ranendra Roy; Paul Kwok Keung Ho; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/618,262

(22) Filed: Jul. 18, 2000

(51) Int. Cl.⁷ .................................................. H01L 21/44
(52) U.S. Cl. ........................................ 438/687; 438/906
(58) Field of Search ..................................... 438/687, 906

(56) References Cited

U.S. PATENT DOCUMENTS

| | | | |
|---|---|---|---|
| 5,087,485 | * 2/1992 | Cho | 427/253 |
| 5,431,774 | * 7/1995 | Douglas | 216/57 |
| 5,744,192 | 4/1998 | Nguyen et al. | 427/99 |
| 5,767,301 | 6/1998 | Senzaki et al. | 556/9 |
| 5,939,334 | 8/1999 | Nguyen et al. | 438/689 |

* cited by examiner

Primary Examiner—John F. Niebling
Assistant Examiner—Lynne A. Gurley
(74) Attorney, Agent, or Firm—George O. Saile; Rosemary L. S. Pike

(57) ABSTRACT

An effective copper decontamination method in the fabrication of integrated circuits is achieved. An organic-based HFACAC decontamination compound in vapor phase is sprayed over elemental copper found on equipment or tools or as a spill wherein the compound reacts with all of the elemental copper and forms a volatile compound that can be flushed away thereby completing copper decontamination.

16 Claims, 1 Drawing Sheet

APPLICATION OF VAPOR PHASE HFACAC-BASED COMPOUND FOR USE IN COPPER DECONTAMINATION AND CLEANING PROCESSES

BACKGROUND OF THE INVENTION (1) Field of the Invention

The invention relates to a method of copper decontamination and cleaning of surfaces and tools in the fabrication of integrated circuits, and more particularly, to a method of copper decontamination and cleaning of surfaces and tools by dissolving copper in a vapor phase.

(2) Description of the Prior Art

The evolution of copper interconnect processes in the semiconductor manufacturing industry involves integrating copper into the existing fabrication process, which consists mainly of aluminum processes. In such dual-metal Fabs, incidents of copper spills and factory-wide cross-contamination must be contained. At present, Isopropyl Alcohol is commonly used to wipe and clean copper. This method is inadequate as traces of copper are usually left in minute quantities sufficient to cause further contamination It is desired to provide an effective method of cleaning copper spills and completely removing copper contamination from the surface of tools and equipment.

U.S. Pat. No. 5,939,334 to Nguyen et al teaches cleaning of copper oxides on copper lines by using β-diketone vapor. This method uses a reaction that is almost exclusively to copper oxide and not to copper. U.S. Pat. No. 5,744,192 to Nguyen et al and U.S. Pat. No. 5,767,301 to Senzaki et al teach the use of hfac as a precursor in copper deposition.

SUMMARY OF THE INVENTION

A principal object of the present invention is to provide an effective and very manufacturable method of removing copper contamination of tools and equipment in the fabrication of integrated circuits.

Another object of the present invention is to provide an effective and very manufacturable method of removing copper contamination of tools and equipment in the fabrication of integrated circuits by dissolving copper contamination in a vapor phase.

Yet another object of the present invention is to provide an effective and very manufacturable method of removing copper contamination from any equipment without corroding or destroying equipment parts.

A still further object is to provide a novel copper decontamination process using an organic-based HFACAC compound in vapor phase.

In accordance with the objects of this invention an effective copper decontamination method in the fabrication of integrated circuits is achieved. A decontamination compound in vapor form is sprayed over elemental copper wherein the compound dissolves all of the elemental copper and forms a volatile compound that can be flushed away thereby completing copper decontamination.

Also in accordance with the objects of the invention, a novel organic-based HFACAC decontamination compound in vapor phase is provided. The HFACAC decontamination compound in vapor phase is sprayed over elemental copper wherein the compound dissolves all of the elemental copper and forms a volatile compound that can be flushed away thereby completing copper decontamination.

BRIEF DESCRIPTION OF THE DRAWINGS

In the accompanying drawings forming a material part of this description, there is shown.

DESCRIPTION OF THE PREFERRED EMBODIMENTS

Figure 1:
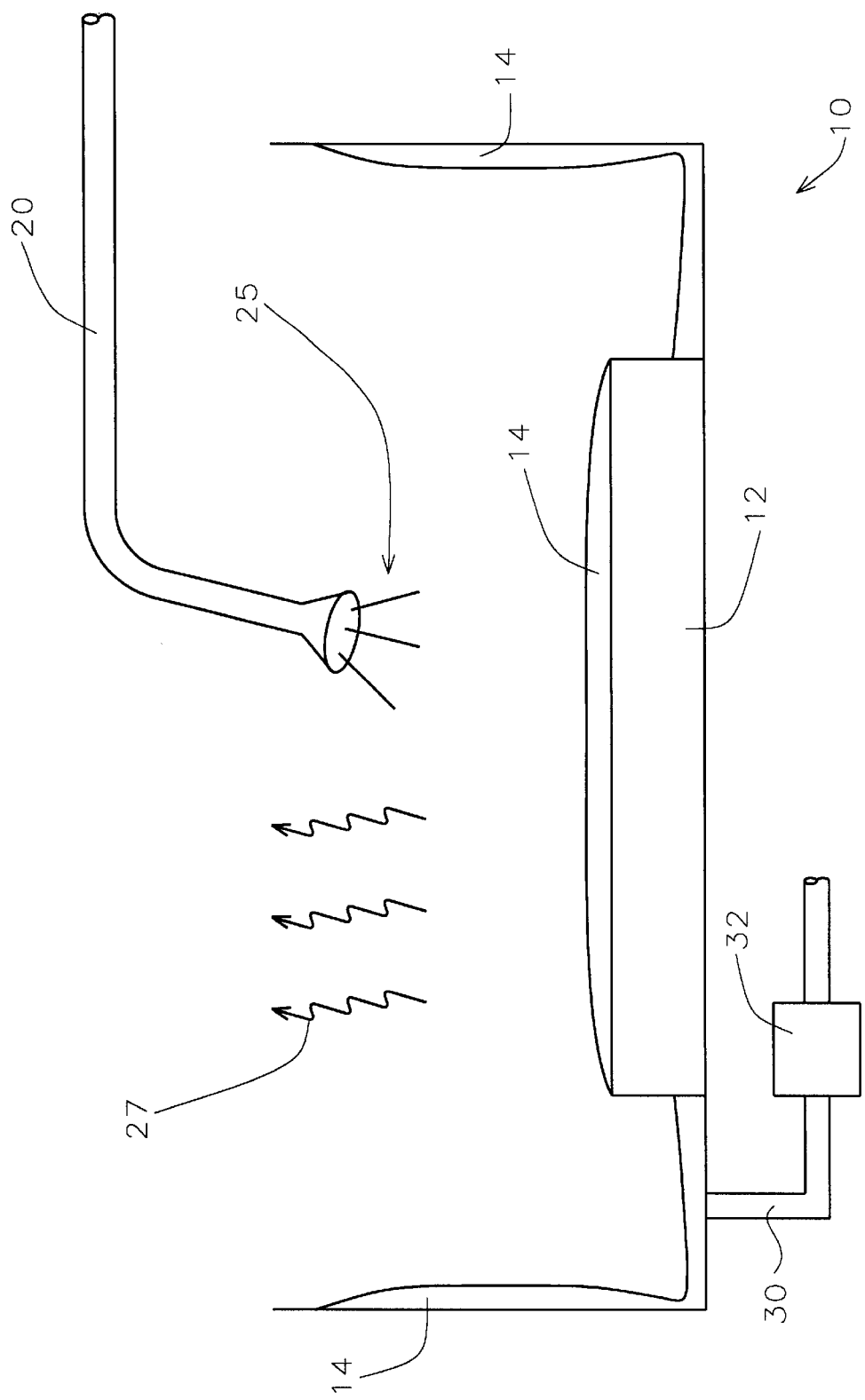
FIG. 1 schematically illustrates in cross-sectional representation equipment from which copper contamination is removed in the process of the present invention.

Copper spills and contamination may be found in many places in a factory, such as on copper dedicated tools and on shared tools and equipment, and in both open and remote sites. It is to be understood by those skilled in the art that the process of the present invention is not limited to the applications illustrated in the drawing figure. Rather, the process of the invention can be used in any application in which it is desired to provide an effective method of copper removal.

The copper decontamination process of the invention can be performed on any equipment found in a wafer fabrication plant. Copper decontamination can be performed after the wafer or wafers have been processed, during preventive maintenance, or after breakage of a wafer or wafers in the equipment.

FIG. 1 illustrates a typical tool or piece of equipment used in semiconductor manufacturing. A chamber 10 contains a wafer chuck 12 on which a wafer is held for processing. Copper contamination 14 is shown on the wafer chuck and on the walls of the chamber.

The process of the invention proposes a novel method for safe and effective removal of copper in any application. The process of the invention can be employed without corroding or destroying the equipment.

An organic-based hexafluoroacetylacetone (HFACAC) or 1,1,1,5,5,5-hexafluoro-2,4-pentanedione compound is flowed through a spray nozzle 20 in a vapor phase combined with an inert gas, such as nitrogen, which serves as a carrier. Alternatively, hexafluoroacetylacetate (HFAC) can be introduced into the chamber 10 in a pressurized state. The HFACAC—$CF_3COCH_2COCF_3$— is sprayed at about 0.1 to 100 liters per minute at a temperature of between about 20 and 100° C. for 1 second to 10 minutes. The vapor phase compound 25 is sprayed over the copper contaminated sites and/or surfaces of equipment and tools to react with the elemental copper and/or copper oxides and form a readily volatile compound that can be flushed away.

This volatile compound can be removed from the chamber 10 in the figure through a drain 30, such as by a vacuum pump 32, or otherwise exhausted from the chamber. Vapor 27, comprising $CF_3COCH_2COCF_3$ and nitrogen, is allowed to escape and no residues are left on the contaminated sites, equipment, or tools.

Since the decontamination removal compound is in vapor phase, it can be used to clean both open areas and remote locations that are not easily accessible. It is also an effective decontaminant after spills. In addition, this process may be used for removing copper from the surface of a wafer for reclaiming of the wafer.

The decontamination removal compound of the invention may be used during copper metallic trace detection and analysis for formation of a preconcentrate. A preconcentrate is a copper-containing solution that can be treated by evaporating water and solvents to leave copper concentrates. The HFACAC of the invention can be used to dissolve the contaminents so that the preconcentrate can be analyzed using any of numerous techniques, such as total X-ray Flouresence Spectroscopy (VDP/TXRF), Inactively Coupled Mass Spectroscopy (ICMS), and Atomic Absorption Spectroscopy (AAS).

The process of the present invention provides a method for effective copper decontamination for any application. An organic-based HFACAC decontamination compound in vapor phase is employed to effect the desired copper decontamination.

While the invention has been particularly shown and described with reference to the preferred embodiments thereof, it will be understood by those skilled in the art that various changes in form and details may be made without departing from the spirit and scope of the invention.

What is claimed is:

1. A method of copper decontamination in the fabrication of an integrated circuit comprising:

spraying from a nozzle in combination with an inert gas as a carrier a decontamination compound in vapor form over elemental copper wherein said compound reacts with all of said elemental copper and forms a volatile compound that can be flushed away thereby completing said copper decontamination.

2. The method according to claim 1 wherein said decontamination compound comprises an organic-based HFACAC compound.

3. The method according to claim 1 wherein said decontamination compound comprises an organic-based HFAC compound.

4. The method according to claim 1 wherein said step of spraying said decontamination compound is done under pressure.

5. The method according to claim 1 wherein said elemental copper is found on surfaces of equipment and tools.

6. The method according to claim 1 wherein said elemental copper is found on wafers to be reclaimed.

7. The method according to claim 1 wherein said elemental copper is found on surfaces after a spill.

8. A method of copper decontamination in the fabrication of an integrated circuit comprising:

spraying an organic-based HFACAC compound in vapor form in combination with an inert gas as a carrier over elemental copper wherein said compound reacts with all of said elemental copper and forms a volatile compound that can be flushed away thereby completing said copper decontamination.

9. The method according to claim 8 wherein said elemental copper is found on surfaces of equipment and tools.

10. The method according to claim 8 wherein said elemental copper is found on wafers to be reclaimed.

11. The method according to claim 8 wherein said elemental copper is found on surfaces after a spill.

12. A method of copper decontamination in the fabrication of an integrated circuit comprising:

spraying an decontamination compound in vapor form chosen in combination with an inert gas as a carrier over elemental copper found on surfaces of equipment and tools wherein said compound reacts with all of said elemental copper and forms a volatile compound that can be flushed away thereby completing said copper decontamination.

13. The method according to claim 12 wherein said decontamination compound comprises an organic-based HFACAC compound.

14. The method according to claim 12 wherein said decontamination compound comprises an organic-based HFAC compound.

15. The method according to claim 12 wherein said step of introducing said decontamination compound is done under pressure.

16. The method according to claim 12 wherein said elemental copper is found also on wafers to be reclaimed and on surfaces after a spill.

* * * * *